United States Patent
Bahl et al.

(10) Patent No.: US 7,273,091 B2
(45) Date of Patent: Sep. 25, 2007

(54) COOLING APPARATUS FOR HEAT GENERATING DEVICES

(75) Inventors: Manish Bahl, New York, NY (US); Lawrence S. Mok, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 479 days.

(21) Appl. No.: 10/828,428

(22) Filed: Apr. 20, 2004

(65) Prior Publication Data
US 2005/0231916 A1    Oct. 20, 2005

(51) Int. Cl.
*H05K 7/20*    (2006.01)

(52) U.S. Cl. .................. 165/121; 165/104.33; 165/125; 361/700; 361/697

(58) Field of Classification Search ........... 165/104.33, 165/122; 361/697, 700
See application file for complete search history.

(56) References Cited

U.S. PATENT DOCUMENTS

| | | | | |
|---|---|---|---|---|
| 3,273,865 A | * | 9/1966 | White | ............... 366/307 |
| 3,275,223 A | * | 9/1966 | Fowell | ............... 415/53.1 |
| 5,192,183 A | * | 3/1993 | Wilkinson | ............... 415/90 |
| 5,297,617 A | | 3/1994 | Herbert | |
| 5,309,983 A | | 5/1994 | Bailey | |
| 5,335,143 A | | 8/1994 | Maling, Jr. et al. | |
| 5,388,958 A | | 2/1995 | Dinh | |
| 5,419,679 A | | 5/1995 | Gaunt et al. | |
| 5,445,215 A | | 8/1995 | Herbert | |
| 5,794,687 A | | 8/1998 | Webster, Jr. et al. | |
| 6,503,067 B2 | | 1/2003 | Palumbo | |
| 6,625,021 B1 | * | 9/2003 | Lofland et al. | ............. 361/697 |
| 6,659,169 B1 | * | 12/2003 | Lopatinsky et al. | ......... 165/121 |
| 6,892,800 B2 | * | 5/2005 | Mok | ............. 165/104.33 |
| 6,945,318 B2 | * | 9/2005 | Ma et al. | ............. 165/104.33 |
| 2006/0102324 A1 | * | 5/2006 | Mok et al. | ............. 165/104.33 |

* cited by examiner

*Primary Examiner*—Allen J. Flanigan
(74) *Attorney, Agent, or Firm*—Scully, Scott, Murphy & Presser, P.C.; Daniel P. Morris, Esq

(57) ABSTRACT

A cooling apparatus for heat generating devices such as semiconductor chips comprises a parallel disk fan in the middle of a set of heat sink fins. The parallel disk fan has radial elements placed between the disks to efficiently create air flow without turbulence. Cooling efficiency is further enhanced when heat dissipation through the parallel disks of the fan is introduced.

11 Claims, 7 Drawing Sheets

COOLING APPARATUS FOR HEAT GENERATING DEVICES

BACKGROUND OF THE INVENTION

1. Field of the Invention

The present invention relates generally to cooling devices for devices that generate heat such as semiconductor chips, and particularly, to an apparatus that improves the capability and reliability of cooling devices for semiconductor chips. The invention is in the field of heat transfer and cooling of semiconductor chips used in computers and telecommunication equipment.

2. Description of the Prior Art

As the power of semiconductor chips increases, more efficient cooling device for semiconductor chips is therefore required. Current known cooling solutions have drawbacks in providing an adequate cooling to chips in small spaces and, drawbacks in lowering acoustic noise. For instance, U.S. Pat. Nos. 5,297,617, 5,309,983, and 5,445,215 each describe methods of using miniature "muffin fans" with multi-bladed propellers that drive cooling air toward heat collector fins at the periphery. These muffins fans tend to be nosier because the air is stirred up and pushed to the heat collector fins. U.S. Pat. No. 5,419,679 teaches a method using parallel disks to create air flow to draw air through an opening in an attached chassis for cooling electronic devices. U.S. Pat. No. 5,335,143 teaches a method using parallel disks between fins of a heat exchanger to provide cooling of chips. The arrangement is rather bulky, however, with only a small portion of a disk pumping air at any given time. U.S. Pat. No. 5,794,687 teaches a method of placing parallel disks in close fitting slots formed in a heat conducting housing. Methods of ducting incoming and outgoing air are additionally described.

U.S. Pat. No. 5,388,958 describes a "bladeless impeller" consisting of a plurality of disks and introduces a mechanism to transfer heat to the impeller shaft. However, the device needs to be positioned adjacent to an element to provide a complimentary surface to the disks to define a space in which pressure drop would occur on the operation of the impeller. U.S. Pat. No. 6,503,067 teaches a method using parallel disks to create laminar air flow for intake into an Internal combustion engine.

It would be highly desirable to provide a cooling apparatus for heat generating devices such as semiconductor chip devices that obviates the aforementioned deficiencies in the prior art.

SUMMARY OF THE INVENTION

The present invention relates to a cooling apparatus for heat generating devices such as semiconductor chips and devices, e.g., in computers and telecommunications equipment.

The apparatus includes a plurality of parallel disks that rotate at the center of a set of heat transfer fins and periodic radial elements placed between disks to generate air flow more efficiently while maintaining the air stream less turbulent. The air leaving the edge of the parallel disks as the disks rotate is more easily directed into the surrounding heat transfer fins. This arrangement of rotating disks creates air flow more efficiently. Furthermore, an array of heat pipes carrying heat from the source to the rotating disks increases the surface area of heat dissipation, leading to more efficient cooling. Additionally provided is a mechanism of transferring heat from a heat generating device to the rotating disks.

Thus, according to the invention, there is provided a cooling apparatus comprising: a fan means for creating a smooth, less turbulent air flow including a plurality of disk fan elements spaced apart in a stack configuration and adapted for rotation to create an air flow; multiple heat sink means surrounding the plurality of disk fan elements; a heat distribution means for receiving heat generated from a heat generating device; and, a plurality of heat pipe elements communicating with the heat distribution means and the multiple heat sinks, the heat distribution means and heat pipe elements transferring heat from a heat generating device for distribution to the heat sinks, wherein the plurality of disk fan elements are rotated to create efficient air flow in an outward direction such that heat is uniformly eliminated from the surrounding multiple heat sink means.

In a further embodiment, the cooling apparatus further comprises a heat transfer means for transferring additional heat from the heat distribution block to one or more of the plurality of disk fan elements.

Still in a further embodiment, the plurality of disk fan elements may be mounted on a hollow shaft whereby a motor drive means for rotating the shaft is integrated in the shaft. Further, the hollow shaft is configured to include a plurality of air slots located along a length of the shaft for permitting air to pass through the shaft as the shaft rotates and exit the formed air gaps. Thus, further cooling efficiency is enhanced as heat is dissipated through the parallel disks of the fan.

BRIEF DESCRIPTION OF THE DRAWINGS

The objects, features and advantages of the present invention will become apparent to one skilled in the art, in view of the following detailed description taken in combination with the attached drawings in which.

DETAILED DESCRIPTION OF THE PREFERRED EMBODIMENTS

Figure 1:
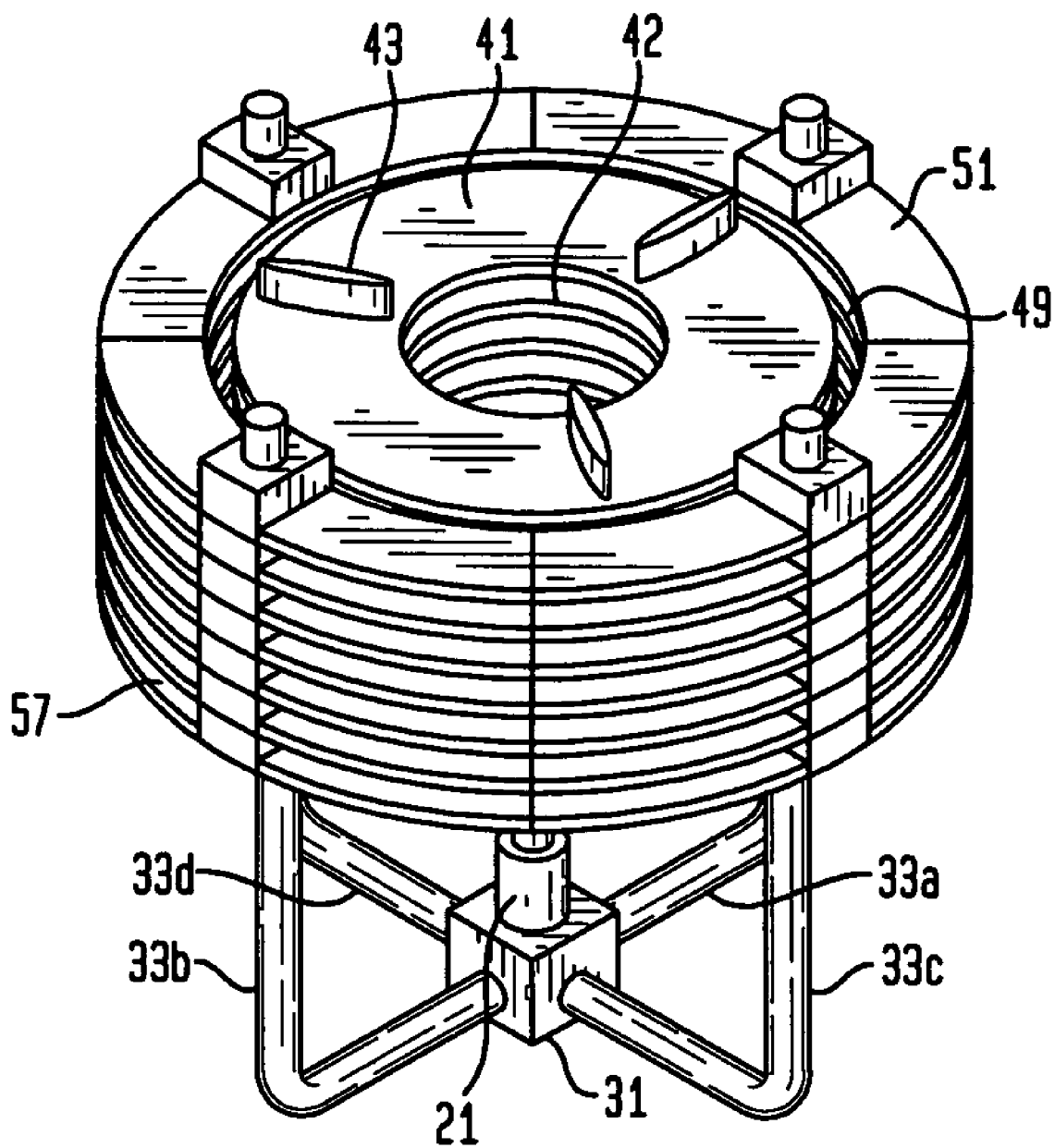
FIG. 1 depicts a three-dimensional (3-D) view of a cooling device with a parallel disk fan in the middle according to the invention.

FIG. 1 depicts generally, the cooling device of the present invention. As shown in FIG. 1, the cooling device includes a plurality of ring-shaped heat sink fins 51 oriented parallel in a stacked configuration with a gap 57 between each ring-shaped heat sink fin, a plurality of circular disk fans 41 oriented parallel in a stacked configuration and coaxial with the plurality of ring-shaped heat sink fins 51, the plurality of stacked circular disk fans 41 being mounted for rotation within the stacked plurality of circular heat sink fins 51 via a shaft under motor control 21. As shown in FIG. 1, and described in greater detail herein, the plurality of heat sink fins 51 are in communication with a structure comprising heating pipe elements 33a, . . . , 33d interconnected with a heat distribution block 31 that receives and distributes heat generated by a semiconductor chip to the heat sink fins. Preferably, as shown in FIG. 1, the parallel circular disk fans 41 each include radial elements 43 between disks 41 in the middle of the set of circular parallel-stacked heat sink fins 51. More specifically, the parallel disk fans include a plurality of disks 41 stacked in parallel on a shaft of an electric motor 21 and the disks 41 are separated by the radial elements 43 such that many air gaps are formed between disks 41. When the parallel disks 41 are rotated by the electric motor 21, a centrifugal force is generated that drives the air in the air gaps to move outward and, hence, a steady stream of less turbulent air is generated. Air comes into the fan from the both sides of fan inlets 42 provided near the center of the parallel disk unit 41 as shown in FIGS. 1 and 2(a).

Figure 2A:
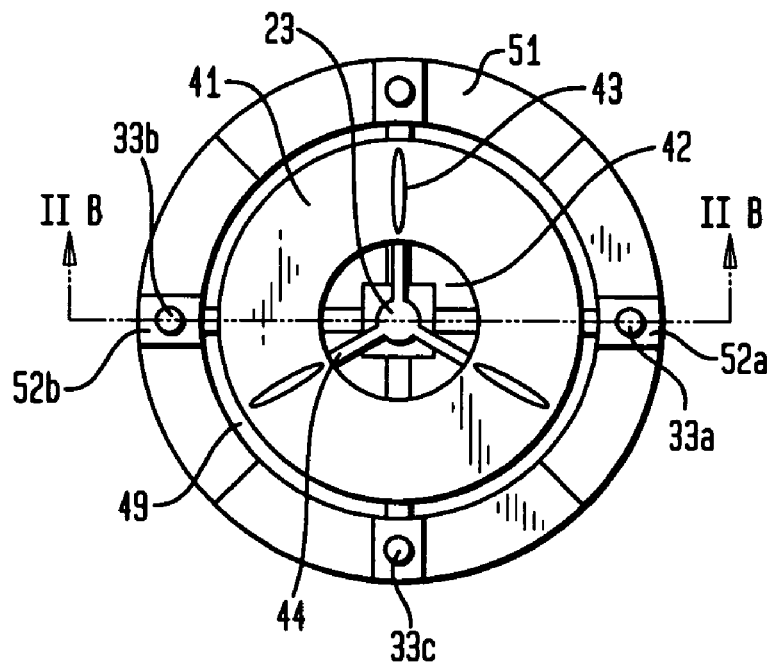
FIG. 2(a) depicts a top view of the cooling device with a parallel disk fan of the invention, and, FIG. 2(b) depicts a cross-sectional view of the cooling device when taken along section 'A-A' of FIG. 2(a)
Figure 2B:
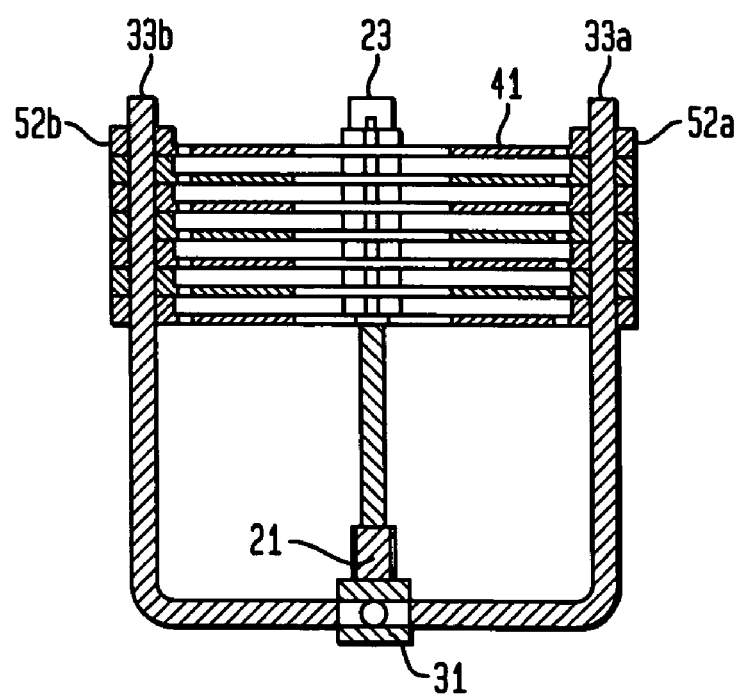

Particularly, FIG. 2(a) depicts a top view of the cooling device with a parallel disk fan of the invention, and, FIG. 2(b) depicts a cross-sectional view of the cooling device when taken along section 'A-A' of FIG. 2(a). The cross-sectional view of FIG. 2(b) particularly details the structure comprising the heating pipe elements, e.g., two elements 33a, 33b, which are L-shaped and interconnect the heat distribution box 31 with the parallel-stacked heat sink fins 51. Located above heat distribution block 31 is the motor 21 and the motor shaft 23 extending upward therefrom that rotatably support the parallel circular disk fans 41. With more particularity, as shown in FIG. 2(a), each parallel circular disk fan 41 is supported by arm members 44 which are mounted on the motor shaft 23. The set of radial elements 43 is placed between disks 41 with three (3) shown in FIGS. 1 and 2(a). It is understood however, that the number and the shape of the radial elements 43 as well as the spacing distance between disk fans 41 may vary. The diameter of the parallel disks may range anywhere from about 25 mm to 200 mm. The number of radial members separating two adjacent disks may range between three (3), as shown in the FIG. 1, to fifteen (15). The radial members can be straightly radial, forward inclined, or backward inclined. The shape of the radial members is preferred to be aerodynamically aligned with the air stream, and may include a circular (rounded) or elliptic shape.

Further, as shown in FIG. 2(a), the multiple heat sink fins 51 that form a ring have an inner diameter that is larger than the diameter of the rotating circular disk fans 41 leaving a small gap 49, e.g., ranging between 0.05 mm to 5 mm, between the fans and the heat sink fins 51 such that the parallel disks 41 can be rotated freely to generate air streams which are forced to pass through the heat sink fin gaps 57 (shown in FIG. 1), that may range, for example, between 0.2 mm to 3 mm. The heat sink fins 51 are additionally separated by spacer elements 52a, 52b to result in gaps 57 and may be soldered, brazed, or glued to the corresponding spacer elements 52a, 52b which have heat pipe elements 33 inserted therein. The exemplary heat sink fins 51 in FIG. 2(b) have four sections and each has its designated spacers and heat pipes labeled as 52a, 52b, 52c, 52d, and 33a, 33b, 33c, 33d, respectively, however, it should be understood that the number of the heat sink fins, spacers, and heat pipes may be varied and should not be limited to four (4) as shown in the figures. As mentioned, the lower end of each heat pipe 33 is inserted into the heat distribution block 31 that is to be placed on a heat generating semiconductor chip (not shown).

In operation, heat generated in the semiconductor chip are collected by heat distribution block 31 and transferred by the heat pipes 33 and distributed to the heat sink fins 51. The air stream driven by the parallel disk fans 41 pass through the air gap 57 between the heat sink fins 51 and carry away the heat from the semiconductor chip. While the number of disk fans 41 may vary, i.e., are not limited to seven (7) fins as shown in FIG. 2(b), the heat sink fin spacers 52 are stacked closely up along the heat pipes 33 such that heat can be distributed evenly to all the heat sink fins 51. Preferably, the distance between adjacent disks may range between 0.2 mm to 3 mm and the distance between adjacent fins 51 additionally ranges from 0.2 mm to 3 mm. It is understood however, that the distance between adjacent disks does not have to match the distance between adjacent fins.

It should be understood that in accordance with each of the embodiments of the invention depicted herein, the amount of air flow generated by the parallel disk fan depends primarily upon the rotational speed of the disks, the diameter of the disks, the spacing between disks, and the number of the radial elements 43 between disks 41. The range of the rotational speed may range between about 100 rpm to 10,000 rpm, for example.

Figure 3:
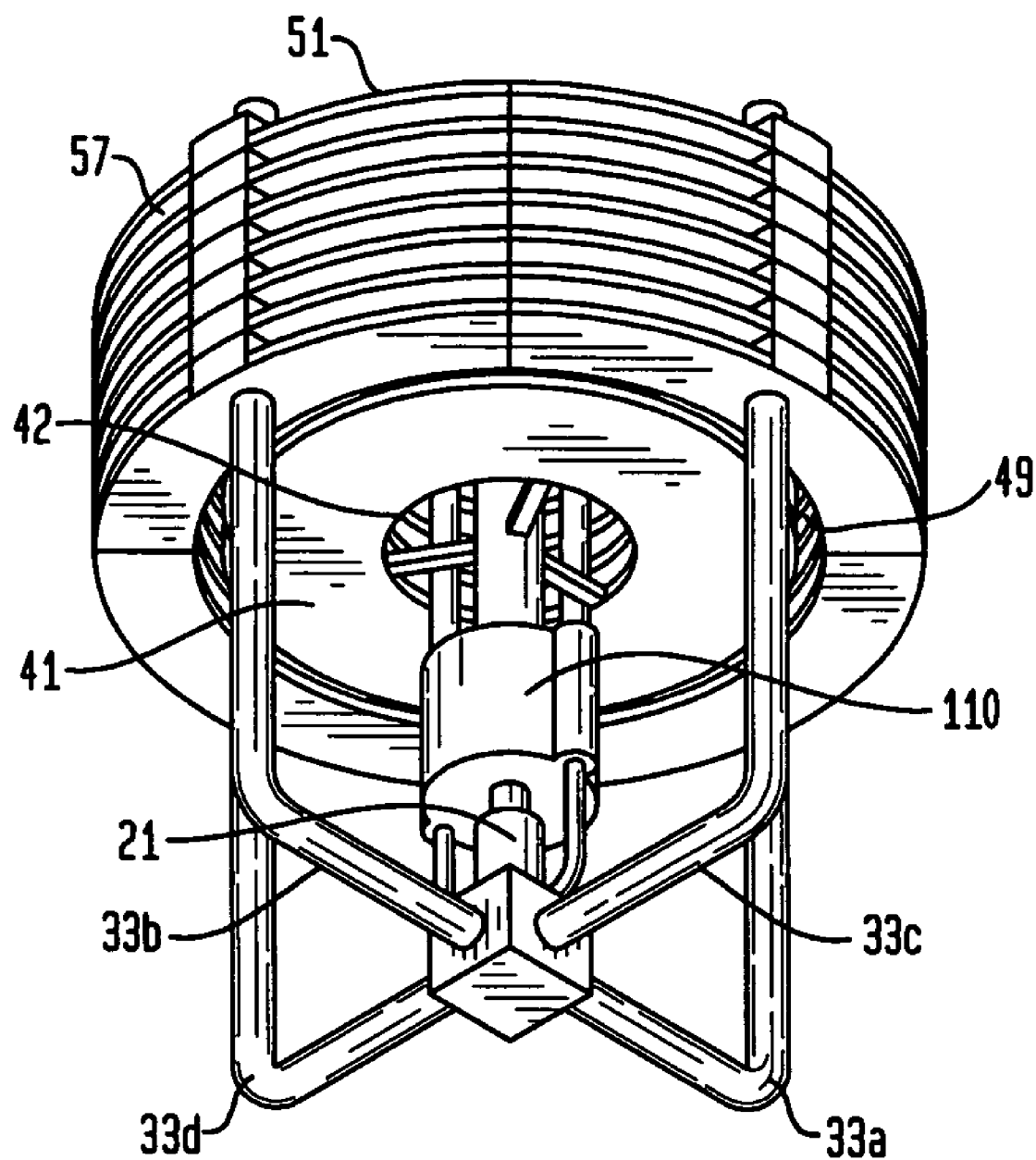
FIG. 3 depicts a 3-D view of an active cooling device according to a further embodiment of the invention

FIG. 3 depicts a 3-D view of an active cooling device according to a further embodiment of the invention. Particularly, in the embodiment depicted in FIG. 3, the active cooling device of FIG. 1 is provided with a heat transfer mechanism 110 attached to the parallel disk fan such that the disks are also used to dissipating heat to the air streams. The active cooling device has a set of parallel disks 41 coaxial therewith and functioning as a fan for the surrounding plurality of heat sink fins 51. The parallel disks 41 are mounted on the shaft of an electric motor 21 that rotates the disks 41 to generate air streams. Air streams coming in from the top and bottom of the fan inlets 42 are driven out from the edge of the disks toward the heat sink fins 51 and will pass through the fin gaps 57. The heat transfer mechanism 110 in the device includes heat pipes connecting with one or more of the parallel disks 41 to transfer heat to the connected discs while allowing them to rotate freely to generate air streams.

Figure 4A:
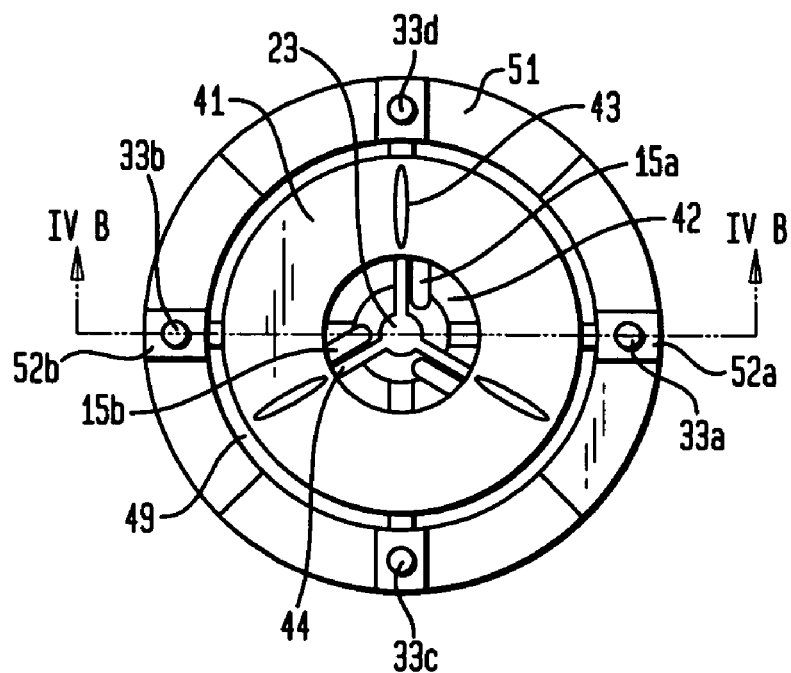
FIG. 4(a) depicts a top view of the cooling device with a parallel disk fan according to a further embodiment of the invention, and, FIG. 4(b) depicts a cross-sectional view of the cooling device when taken along section 'A-A' of FIG. 4(a)
Figure 4B:
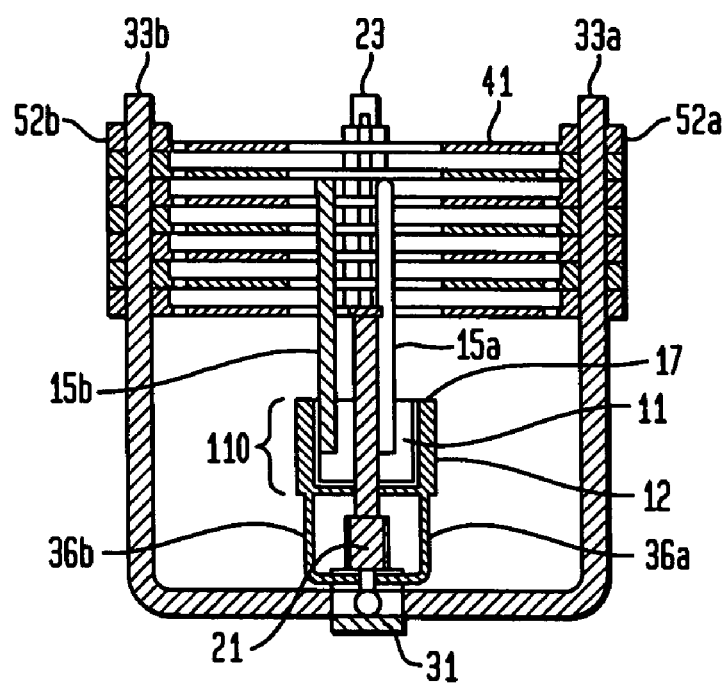

The details of the heat transfer mechanism 110 are now described herein with respect to FIGS. 4(a) and 4(b). Particularly, FIG. 4(a) depicts a top view of the cooling device with a parallel disk fan according to a further embodiment of the invention, and, FIG. 4(b) depicts a cross-sectional view of the cooling device when taken along section 'A-A' of FIG. 4(a). It is understood that all elements except the heat transfer mechanism 110 are the same as included in the first embodiment described with respect to FIGS. 1 and 2(a)-2(b). The heat transfer mechanism 110 includes an outer stationary part comprising a fixed outer casing 12 and one inner cylindrical rotational part 11 located coaxially therewith that rotates with respect to the outer casing 12 that is hollowed for receiving heat from the heat distribution block 31. Preferably, a cylindrical outer surface of the rotational part 11 is separated from the inner surface of the stationary part 12 by a narrow gap 17, for example, ranging from about 0.01 mm to 1 mm. The cylindrical rotational part 11 is mounted on the shaft of the motor 21 such that the rotational part can be rotated freely within the stationary part 12. The gap 17 is filled with thermally conductive lubricants such as Krytox lubricants from Dupont, or like equivalent, for conducting heat from the fixed outer casing to the rotating inner part. Suitable sealing mechanisms (not shown) are provided on the shaft of the rotational part 11 to protect the lubricants as is well known in the art. As further shown in FIG. 4(b), there are two heat pipes 36a and 36b that connect between the fixed outer casing 12 and the heat distribution block 31 such that heat can be additionally transferred to the stationary part 12 from the heat distribution block 31. It is understood that additional heat distribution pipes may communicate heat from the heat distribution block to the stationary part 12. Further, heat transferred to the outer stationary part may then be transferred to the rotational part 11 through the intermediary of the thermally conductive lubricants. Heat is further transferred to the set of parallel disks 41 through the heat pipes 15a, 15b that are shown connecting the inner rotational part 11 to several disks 41 by suitable mounting means (such as shown herein with respect to FIGS. 5(a) and 5(b)) and are rotatable therewith. Because of this heat transfer mechanism 110, heat can now be distributed to the parallel disks and dissipated there while generating less turbulent air flows.

Figure 5A:
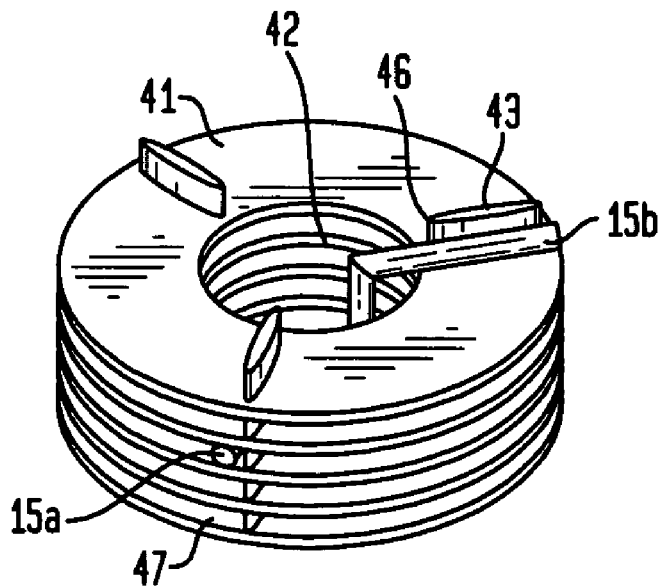
FIGS. 5(a) and 5(b) depict the detailed mounting of heat pipes to the parallel disks according to the embodiment of the invention depicted in FIGS. 4(a), 4(b)
Figure 5B:
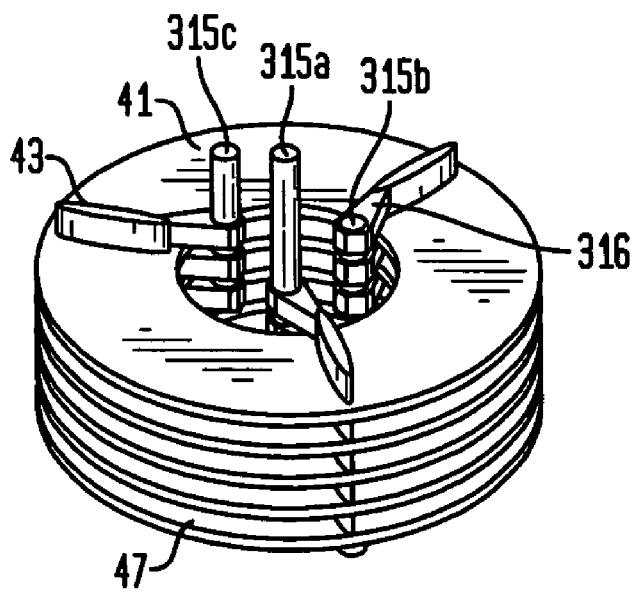

FIGS. 5(a) and 5(b) depict alternate embodiments for mounting the heat pipes to the rotational disks 41. FIG. 5(a) particularly depicts the end portion of a heat pipe 15b that is bent at an upper end to lie in parallel to one of the disks near a radial member 43. That portion of the heat pipe may be soldered, epoxied or otherwise equivalently attached to the disk 41 and the radial member 43 at location indicated as 46 in FIG. 5(a). Additionally shown in FIG. 5(a) is the attachment of a bent upper portion of heat pipe 15a attached between two disks in a gap 47 near radial member. FIG. 5(b) illustrates another embodiment of the mounting method in which the end of the heat pipes, 315a, 315b, and 315c, are not bent. Rather, a solid metal extension 316 may be used to bridge the radial members 43 and the heat pipes as depicted in FIG. 5(b).

Figure 6A:
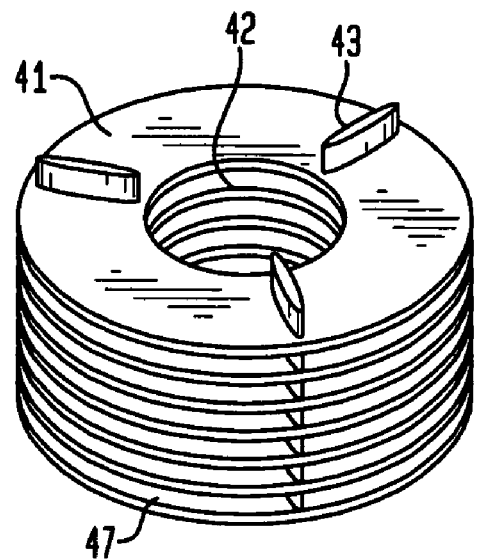
FIGS. 6(a) and 6(b) depict two different embodiments respectively, of the parallel disk fan in the cooling device with a flat parallel disk configuration as shown FIG. 6(a) and a corrugated disk configuration as shown in FIG. 6(b); and, FIGS. 7(a)-7(c) each depict an implementation of the parallel disk fan using a hollow shaft integrated with an electric motor according to the invention.
Figure 6B:
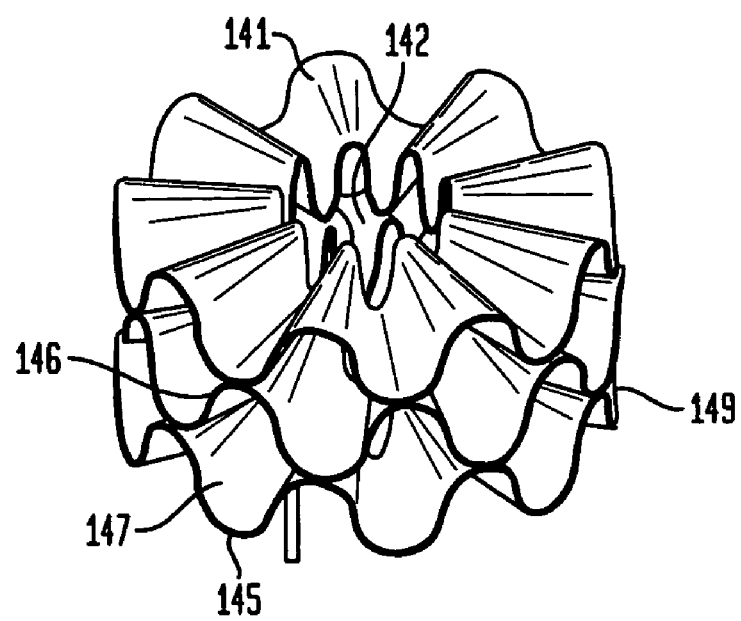

FIG. 6 depicts two versions of the parallel disks, one is flat configuration as shown FIG. 6(a) and the other is corrugated as shown in FIG. 6(b). In the flat parallel disks version depicted in FIG. 6(a), the disks are separated by the radial elements 43 between disks to create air gaps 47. Air comes from the inlets 42 from both sides of the parallel disks. In the corrugated disks set depicted in FIG. 6(b), the radial elements are not needed because of the corrugated nature of the disks 141. Rather, the adjacent disks 141 are aligned in a way that the disks can be joined together at locations 149 and form air outlets 47 all around the disks. Thus, in the corrugated disk set, air comes from the inlets 142. As shown in FIG. 6(b), a trough 145 of the corrugated disk fan element is connected to a peak 146 of an immediately adjacent corrugated disk fan element to form the air channels 147 enabling a smooth air flow with less turbulence when the disk fans rotate. As shown in FIG. 6(b), these air channels 147 are cone shaped.

Figure 7A:
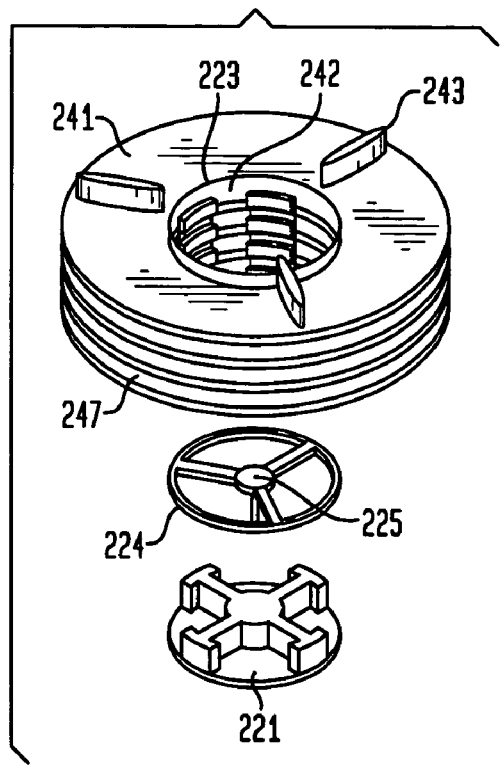
Figure 7B:
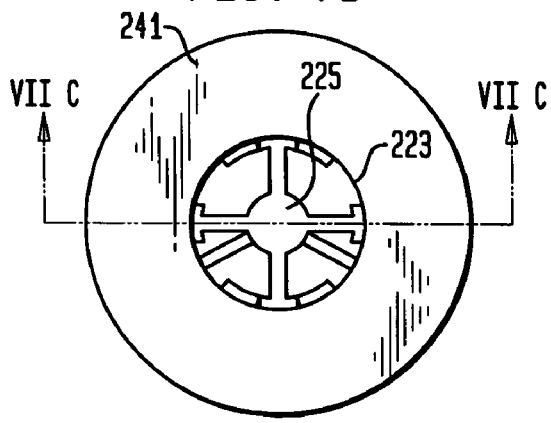
Figure 7C:
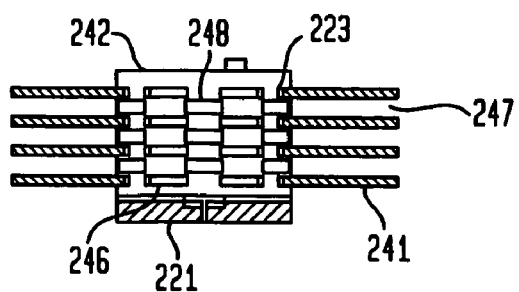

FIGS. 7(a)-7(c) depict another embodiment of the cooling device of the invention that utilizes a hollow shaft to hold the plurality of parallel disks with an electric motor integrated in the shaft with FIG. 7(c) depicting a cross-sectional view of the cooling device when taken along section 'A-A' of FIG. 7(b). As shown in FIG. 7(c), each disk 241 of the parallel disk set is mounted on the hollow shaft 223 as indicated by disk mounting holes 246 where the disks 241 will anchor on the hollow shaft 223. As further shown in FIG. 7(c), at locations located between each disk anchor mount 246 of the shaft are air slots 248 that permit air to pass through the shaft. Returning to the exploded view of FIG. 7(a), radial elements 243 are placed between the disks 241 as in the other embodiment described herein to form gaps 247 between each disks. In operation, as the shaft rotates, air will enter into the hollow shaft 223 from a top opening 242 (FIG. 7(a)), and pass through the air passing slots 248, and will exit between disk gaps 247. At one end of hollow shaft 223, a magnetic ring 224 is provided that is supported by a shaft member 225. The magnetic ring 224 has alternating magnetic poles (north and south) such that when an electric winding plate 221 is mounted beneath and energized, the magnetic ring 224 will be driven to rotate accordingly. The details of the windings in the electric winding plate 221 are not shown however, are similar to well-known brushless motor configurations. Control circuitry is provided that is similar to brushless motor devices as would be known to skilled artisans.

It is understood that the arrangement of rotating disks according to the invention, creates a more turbulent-free air flow, and accordingly increases heat transfer efficiencies.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A cooling apparatus comprising:
   fan means for creating an air flow including a plurality of disk fan elements spaced apart in a stack configuration and adapted for rotation to create said air flow;
   multiple heat sink means surrounding said plurality of disk fan elements;
   a heat distribution block for receiving heat generated from a heat generating device;
   a plurality of heat pipe elements communicating with said heat distribution block and said multiple heat sinks, said heat distribution block and heat pipe elements transferring heat from said heat generating device for distribution to said heat sinks;
   a motor drive means for rotating said plurality of disk fan elements, said motor drive means including a shaft means for mounting said plurality of disk fan elements in said stack configuration, said shaft means comprising a hollow shaft, said motor drive means being integrated in the shaft means; and,
   at least one radial element located in spaced apart relation on each disk fan element and positioned between adjacent disk fan elements to form air gaps between said disk fan elements;
   wherein said plurality of disk fan elements are rotated to create an efficient, less turbulent air flow in an outward direction such that heat is uniformly eliminated from said surrounding multiple heat sink means.

2. The apparatus as claimed in claim 1, wherein said at lest one radial element is aerodynamic and comprises a rounded shape.

3. The apparatus as claimed in claim 1, wherein said at lest one radial element is aerodynamic and comprises an elliptic shape.

4. The apparatus as claimed in claim 1, further comprising a plurality of slots located along a length of said hollow shaft for permitting air to pass through the shaft as said shaft rotates and exit said formed air gaps.

5. The apparatus as claimed in claim 1, wherein each said multiple heat sink means is positioned to surround said plurality of disk fan elements.

6. The apparatus as claimed in claim 1, wherein each said disk fan element is flat and stacked in a parallel configuration.

7. The apparatus as claimed in claim 1, wherein each said disk fan element is corrugated and locations of each said corrugated disk fan element are connected to complementary locations of an adjacent corrugated disk fan element to provide air gaps between said corrugated disk fan elements to enable less turbulent air flow when rotated.

8. The apparatus as claimed in claim 7 wherein said connected corrugated disk fan elements create a conic shaped air gap.

9. The apparatus as claimed in claim 1, further comprising a heat transfer means for transferring additional heat from said heat distribution block to one or more of said plurality of disk fan elements.

10. The apparatus as claimed in claim 9, wherein said heat transfer means comprises:

a fixed outer casing mounted near said motor drive means;

one or more first heat pipe means connecting said heat distribution block with said fixed outer casing for distributing heat generated from said heat generating device to the outer casing;

an inner rotational part coaxially located within said fixed outer casing, said inner rotational part mounted on said motor drive means and adapted for rotation therewith such that said rotational part freely rotates within the fixed outer casing;

means for conducting heat from said fixed outer casing to said inner rotational part and, one or more second heat pipe means mounted in said inner rotational part and connected with said one or more of said plurality of disk fan elements for rotation therewith, said heat pipe means for conducting heat from said inner rotational part to said one or more of said plurality of disk fan elements.

11. The apparatus as claimed in claim 10, wherein an outer surface of said inner rotational part is separated from the inner surface of the fixed outer casing by a narrow gap, said means for conducting heat from said fixed outer casing to said inner rotational part comprising a fluid coupling layer provided in said gap.

* * * * *